United States Patent [19]

Rothermel

[11] Patent Number: 5,448,205

[45] Date of Patent: Sep. 5, 1995

[54] DELAY CHAIN OSCILLATOR HAVING SELECTABLE DUTY CYCLE

[75] Inventor: Albrecht Rothermel, Villingen-Schwenningen, Germany

[73] Assignee: Deutsche Thomson-Brandt GmbH, Villingen-Schwenningen, Germany

[21] Appl. No.: 175,369

[22] PCT Filed: Jul. 6, 1992

[86] PCT No.: PCT/EP92/01519

§ 371 Date: Jul. 11, 1994

§ 102(e) Date: Jul. 11, 1994

[87] PCT Pub. No.: WO93/02504

PCT Pub. Date: Feb. 4, 1993

[30] Foreign Application Priority Data

Jul. 15, 1991 [DE] Germany .................. 41 23 388.3

[51] Int. Cl.$^6$ .............................................. H03K 3/03
[52] U.S. Cl. ................................. 331/57; 331/DIG. 3
[58] Field of Search ............... 331/57, 34, 25, DIG. 3

[56] References Cited

U.S. PATENT DOCUMENTS

| | | | |
|---|---|---|---|
| 4,023,110 | 5/1977 | Oliver | 328/109 |
| 4,517,532 | 5/1985 | Neidorff | 311/57 |
| 5,059,924 | 10/1991 | JenningsCheck | 331/57 X |
| 5,119,045 | 6/1992 | Sato | 331/57 X |

FOREIGN PATENT DOCUMENTS 0395118 10/1990 European Pat. Off. .

OTHER PUBLICATIONS

IBM Technical Disclosure Bulletin, vol. 15, No. 10, Mar. 1973, New York, U.S., "Delay Line Oscillator" T. L. Jeremiah, pp. 3108–3109.

IBM Technical Disclosure Bulletin, vol. 32, No. 2, Jul. 1989, New York, U.S., "Phase-Locked Loop with Programmable Phase Offset" pp. 473–474.

Patent Abstracts of Japan, vol. 14, No. 151, 22 Mar. 1990 & Japanese Pat. 2010922, Fujitsu Ltd.

Introduction to VLSI Systems, Carver Mead & Lynn Conway-Addison-Wesley Publishing Co., Oct., 1980, pp. 235–236.

*Primary Examiner*—Siegfried H. Grimm
*Attorney, Agent, or Firm*—Joseph S. Tripoli; Peter M. Emanuel; Gregory P. Gadson

[57] ABSTRACT

An oscillator containing a chain of delay components (10.1, . . . , 10.l) and emitting an output signal, the period T of which substantially corresponds to the total delay of the chain. The oscillator has a logic stage (11) to which are applied signals which can be tapped along the chain or generated by additional means. The logic stage affects the input signal of the first delay component (10.1) in the chain. The oscillator may be used as part of a phase detector.

10 Claims, 6 Drawing Sheets

DELAY CHAIN OSCILLATOR HAVING SELECTABLE DUTY CYCLE

FIELD OF THE INVENTION

The present invention relates to an apparatus for generating oscillations.

BACKGROUND OF THE INVENTION

Apparatus for generating oscillations, which are also referred to as oscillators, emit, in known manner, periodic oscillations which exhibit a sinusoidal, rectangular or other such periodic waveform.

These output signals are defined by their amplitude and by their frequency f, whose reciprocal defines the periodic time T which is also referred to as the oscillatory period. Digital switching stages are particularly suited for generating rectangular output signals, The so-called ring oscillator, which is known for example from the book "Introduction to VLSI systems", C. Mead, L. Conway, Addison-Wesley Publishing Company, 1980, represents one known embodiment of an oscillator using digital elements.

A ring oscillator is constructed in such a way that an odd number of inverters are connected one behind the other in series in a chain whereby the output of the last inverter is connected to the input of the first inverter.

Each of these inverters causes a time delay and the oscillatory period T of the output signal is determined by the number of inverters and the respective delay times.

The oscillatory period T itself amounts to twice the total delay time.

For various applications, but in particular in those cases in which the output signal of an oscillator is intended to be monitored by means of a phase controlled (PLL) circuit, it is advantageous if the oscillatory period T substantially corresponds to the total delay time of the inverter chain being used.

SUMMARY OF THE INVENTION

The object of the present invention is to propose an apparatus for generating oscillations which contains a chain of delay elements and which makes it possible to generate periodic oscillations having an oscillatory period T which substantially corresponds to the total delay time of this chain.

In accordance with the invention, it is proposed to connect a chain of delay elements in series and to make taps at predetermined points in this series circuit whereby the signals obtained in this way are supplied to a logic stage which contains logic modules. The logic stage is connected between the output of the last delay element and the input of the first delay element.

Preferably, at least
 a first signal which is derived from the output signal of the last delay element of the chain and
 a second signal which is derived from the output signal of a delay element arranged within the chain
are supplied to the logic stage.

The logic circuit emits an input signal to the input of the first delay element. A periodic stage-output signal is derived from output signals of at least one of the delay elements or from the output signal of the logic stage. This has a periodic time T which substantially corresponds to the total delay time of the delay elements being used, in particular, when taking into account delays in the logic stage or other conceivable elements which may be arranged between the last and the first delay element. The total delay time results from the number of delay elements and their individual delay times.

The second signal causes the logic stage to switch-over the input signal whereby, possibly time delayed, a switch-over of the stage-output signal is effected.

Inverters or other such modules known to the skilled person may be used for example as suitable delay elements.

With this oscillator arrangement, the advantage is achieved that by the use of simple chips, an oscillator is realised which delivers a periodic rectangular signal whose oscillatory period T and/or duty factor TV is predeterminable.

If switch-over means are provided that alter the position of the taps for the first or the second signal, then the frequency and/or the duty factor of the output signal can still be varied thereby even after the oscillator is in operation.

By means of a reference value stage which may be formed for example as a data input device, as a store or the like, and a reference-actual comparison stage which controls the said switch-over means, the output signals can, to a large extent, be predetermined and set.

In a further embodiment, the delay elements are so constructed that the individual delay times of at least some of them are adjustable. The periodic time and/or the duty factor can be set in fine steps by an appropriate control means.

A preferred utilisation of the apparatus for generating oscillations in accordance with the invention (oscillator) consists in that it is used as part of a phase detector.

If the oscillator oscillates with an oscillator-cycle having a predetermined frequency value, then periodic output signals are derivable at the outputs of the individual delay elements which are phase displaced relative to one another.

These phase displaced output signals are supplied to a comparison stage to which, furthermore, a test signal that is to be analysed is supplied. The comparison stage recognises when the test signal exhibits a predetermined value and which of the digital, phase-displaced output signals exhibit a high (logical "1" or "high") value and which exhibit a low (logical "0" or "low") value. The phase angle of the periodic output signal to that of the test signal can thereby be inferred.

One use of the said kind is then very advantageous, in particular, when the values for the frequency and/or the duty factor of the oscillator signal are predeterminable.

This can be achieved in that individual delay times and/or positions of at least some of the delay elements are altered.

A further preferred utilisation of the oscillator in accordance with the invention consists in that it is used as part of a phase controlled (PLL) circuit.

This compares the output phase of any one of the stage-output signals with the reference phase of a reference signal and, in the event of an unwanted difference between these two phases, emits an adjusting signal. By means of the latter, individual delay times and/or positions of at least some of the delay elements are altered so that the said stage-output signal and the reference signal are in phase with one another.

A utilisation of the oscillator in accordance with the invention of this type may serve, inter alia, for maintaining the individual delay times at predetermined values. The phase displacement of a previously mentioned test signal can thereby be very precisely determined.

BRIEF DESCRIPTION OF THE DRAWING

Further features, advantages and details of the invention will be explained in the following embodiments with the help of the drawing. Therein FIG. 2 shows at 2a, 2b and 2c signal waveforms for different versions of the oscillator device in accordance with FIG. 1.

DETAILED DESCRIPTION OF THE INVENTION

Before going in detail into the description of the embodiments, it is pointed out that the individually illustrated blocks in the Figures merely serve for the better understanding of the invention. Usually, some or several of these blocks are combined into units. These may be realised in integrated or hybrid technology or as a program controlled micro-computer or as a part of a program suitable for its control. However, the elements contained in the individual stages may also be executed separately.

Hereinafter, means and signal waveforms in the Figures are each provided with the same reference symbols and, once they have been described, they will only be gone into again in the further description in so far as this is necessary for an understanding of the present invention.

Figure 1:
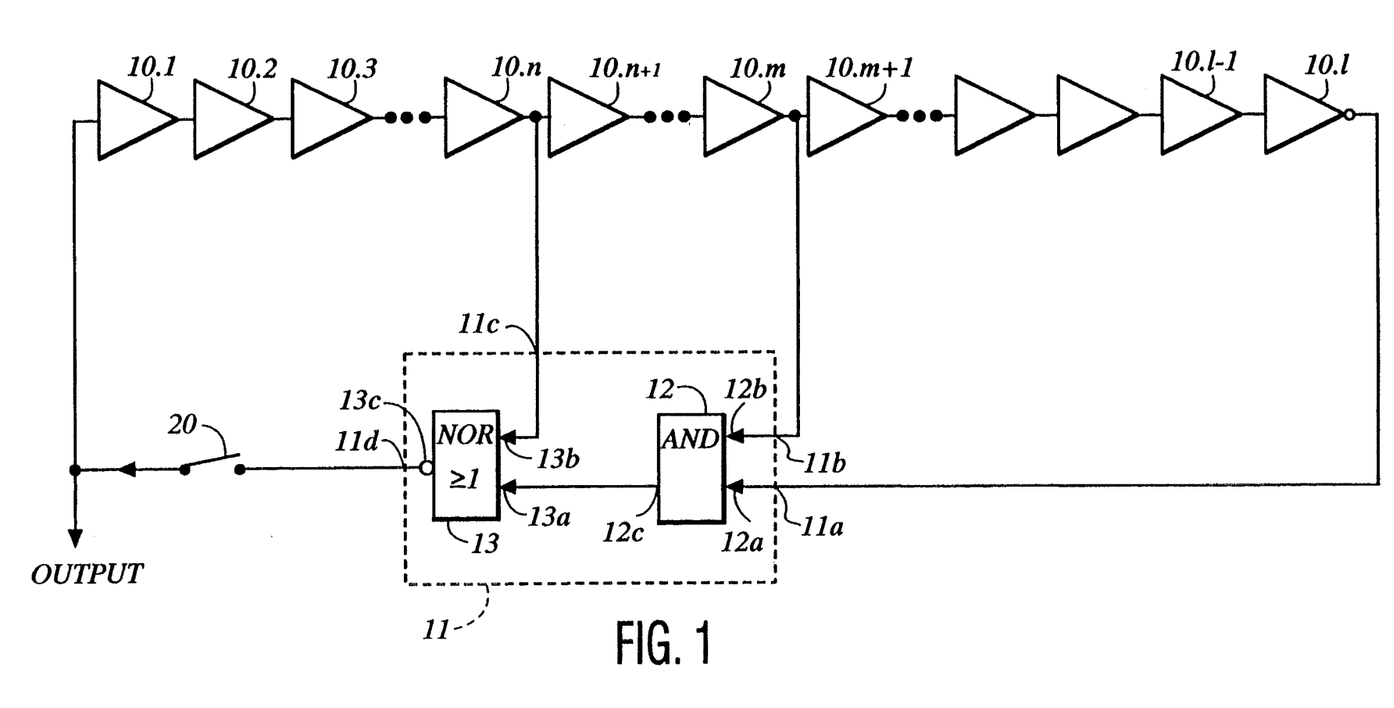
FIG. 1 shows a first embodiment of the oscillator device in accordance with the invention.

FIG. 1 shows a first embodiment of the oscillator device in accordance with the invention.

A chain of delay elements 10.1, ..., 10.l is connected one behind the other in series. A logic stage 11, which has an AND gate 12 and a NOR gate 13 in this embodiment, is connected at its first input 11a, which is identical to the first input 12a of the AND gate 12, to the output of the last delay element 10.l which is constructed as an inverter.

The second input 11b of the logic stage 11, which corresponds to the second input 12b of the AND gate 12, is connected to the output of a delay element 10.m. Furthermore, the latter's output is connected to the input of the delay element 10.m+1.

The output 12c of the AND gate 12 leads to a first input 13a of the NOR gate 13. The latter's second input 13b, which corresponds to the third input 11c of the logic stage 11, is connected to the output of a delay element 10.n which leads additionally to the input of the delay element 10.n+1.

The output 13c of the NOR gate 13, which corresponds to the output 11d of the logic stage 11, leads to the first terminal of a switch 20 whose second terminal is connected to the input of the first delay element 10.1.

The output signal of the oscillator device is also present here.

The operation of versions of the oscillator in accordance with FIG. 1 will be described with the help of the diagrams of FIG. 2, which consists of the parts 2a, 2b and 2c.

In a first version of the embodiment, the chain consists of 32 delay elements i.e. I=32. The last delay element is thus referenced 10.32. 22 is used for m, so that the output of the 22nd delay element 10.22 leads to the second input 11b of the logic stage 11. Furthermore, the output of the 15th (n) delay element 10.15 is connected to the third input 11c of the logic stage 11.

Initially, it will be assumed that all of the inputs of the delay elements 10.1, ..., 10.32 are at logical "0" (low). Consequently, the 32nd delay element 10.32, which is executed as an inverter, emits a signal having logical "1" (high) at its output. Since, initially, low is present on the second input 12b of the AND gate 12, the latter emits a low signal from its output 12c to the first input 13a of the NOR gate 13. Likewise, since a low signal is present on the second input 13b of the NOR gate 13, a high signal is available at the output 13c of the NOR gate 13.

The time waveforms of the output signals of the delay elements 10.22, 10.32, of the AND gate 12, of the delay element 10.15 as well as of the NOR gate 13 are illustrated one below the other in part 2a of FIG. 2. It will be assumed hereinafter that each of the delay elements has a delay time of one unit of time such as is defined by the uppermost line of FIG. 2.

Both the AND gate 12 and the NOR gate 13 each exhibit a delay of one time unit.

At the time point t=0, the switch 20 is closed whereby the high signal of the output 13c of the NOR gate 13 is applied to the input of the first delay element 10.1. Thereby, a first front i.e. a transition from "low" to "high", is caused which reaches the output of the delay element 10.15 (10.n) and hence the second input 13b of the NOR gate 13 (edge A) after a total of 15 time units. This has the effect that at the time point t=16, a low signal, which is supplied to the input of the first delay element 10. 1, is present at the output 13c of the NOR gate 13 (edge B). Thereby, a second front i.e. a transition from "high" to "low" is caused which runs from the input of the first delay element.

At the time point t=22, the first front has reached the output of the delay element 10.22 whereby a high signal is applied to the second input 12b of the AND gate 12 (edge C). Since a high signal is also present at the first input 12a, this has the effect that at the time point t=23, a high signal is present at the output 12c of the gate 12 (edge D). The latter high signal is present simultaneously on the first input 13a of the NOR gate 13 whereby however, its behaviour is not affected since a high signal is already present at the second input 13b.

At the time point t=31, the second front has reached the output of the delay element 10.15 and hence the second input of the NOR gate 13 (edge E). However, as the high output signal of the AND gate 12 is still present at its first input, nothing further happens for a time. At the time point t=32, the first front reaches the output of the last delay element 10.32. Since this last delay element 10.32 is constructed as an inverter, the first front causes a switch-over from "high" to "low" to occur (edge F). This low signal is present simultaneously on the first input 12a of the AND gate 12 whereby this makes a low signal available at the time point t=33

(edge G) at its output 13c. The low signal is present simultaneously on the first input 13a of the NOR gate 13 and causes a switch-over from logical "0" to logical "1" at its output 13c at the time point t=34 (edge H).

This output signal is present simultaneously on the input of the first delay element 10.1 and causes a third front that progresses through the chain of delay elements 10.1, ..., 10.32 and causes switch-overs of the corresponding gates 12 or 13 analogously to those already mentioned. Thereby, edges A', B', C', etc are caused which have a significance analogous to the edges A, B, C, etc that have already been described.

Figure 2A:
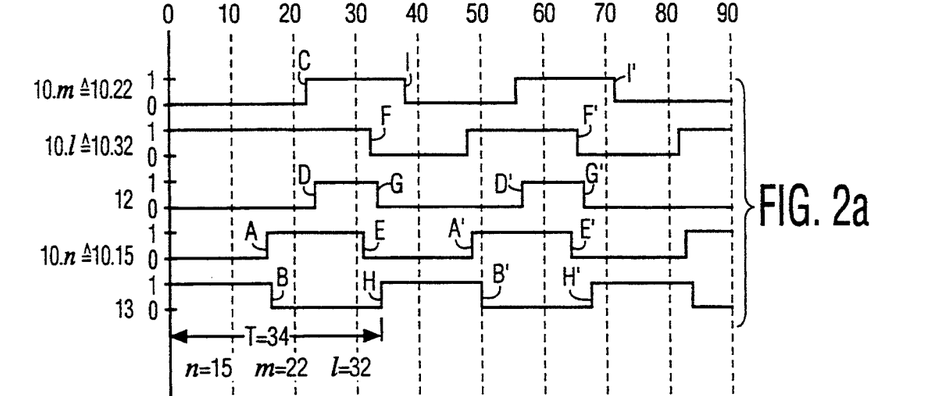

Consequently, a periodic signal, whose waveform is identical with the output signal of the NOR gate 13 and which is drawn as the lowermost curve in part 2a of FIG. 2, is present at the output of the oscillator device. One can see that the periodic time amounts to T=34 time units. This corresponds to the total delay time of the 32 delay elements 10.1, ..., 10.32 and, in addition, of the gates 12 and 13. That means $$T = l + 2.$$

The duty factor TV of this signal, which is defined here as the time for which the signal is "high", to the time for which the signal is "low", amounts to TV = 16 time units: 18 time units.

This duty factor is determined by the position of the nth delay element 10.n:

$$TV = n + 1/(l + 1 - n).$$

The numbers on the right hand side of this relationship arise from the first front needing n units of time in order to reach the output of the nth delay element 10.n. After one further unit of time i.e. after a total of n+1 time units, the switch-over at the output 13c of the NOR gate 13 occurs. Up to then, the oscillator output signal is high.

The denominator i.e. the time, in which the oscillator output signal is low, is determined by $$T - (n + 1) = l + 1 - n.$$

The oscillatory period T is directly dependent on the number of delay elements when the following conditions for n and m are observed:
1.) n must be equal to or smaller than l/2.

The edge E (see FIG. 2a) then occurs in time before the edge F. In the other case i.e. in the event that n is greater than l/2, the edge E occurs in time after the edge F and thus the end of the period of the output signal from gate 13 is not determined by the output signal from element 10.32 which represents a direct measure for the number of delay elements.
2.) m must be smaller than 2 * n.

In the event that m is greater than 2 * n i.e. if m were to be greater than 30 in this example, then the edge C of the curve 10.m would have the effect that the edge D of the output curve of gate 12 rises after the edge E of the curve 10.15 whereby a jump in the output signal 13 would be caused.
3.) m must be equal to or greater than l − (n + 1).

The edge l of the curve 10.m would otherwise fall before the edge F of the curve 10.1. Consequently, both the edge G of the output signal of gate 12 and the output signal of the gate 13 would not depend directly upon the magnitude l i.e. upon the number of delay elements.

It thus ensues that the signals obtained from the outputs of the delay elements 10.n, 10.m and 10.l have to be selected in such a way that a first switch-over of the oscillator output signal (edges B, B', ...) is caused by the output signal of the nth delay element (edges A, A', ...) and a second switch-over of the oscillator output signal (edges H, H', ...) is caused by the switch-over of the last delay element 10.l (edges H, H', ...). Thereby, delays due to the logic stage 11 have to be taken into account.

A manner of operation of this type is realised in this embodiment by processing the output signal of the mth delay element 10.m by the logic stage 11 as indicated. Thereby, m is to be selected as indicated.

The presence of the switch 20 mainly serves to better describe the manner of operation of the embodiment. It is however also conceivable that it serves as an on/off switch.

In the event that the logic stage causes a delay other than the one mentioned, then the values for the oscillatory period T and the duty factor TV alter accordingly.

Figure 2B:
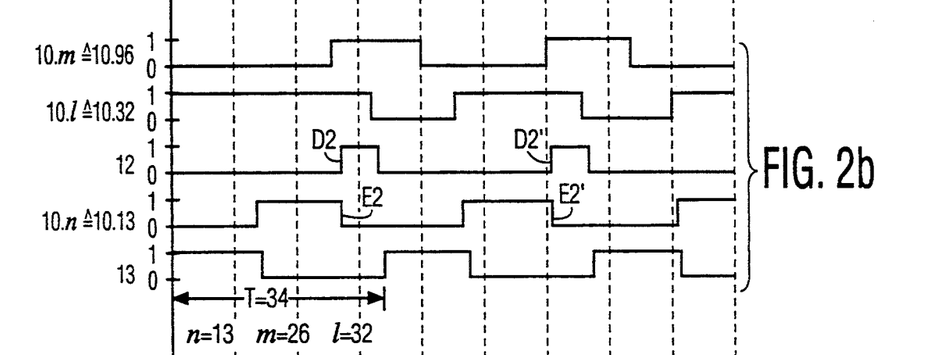

Signal waveforms for a further version of the first embodiment are illustrated in part 2b of FIG. 2. For this, the following parameters were chosen:

n = 13, m = 26, l = 32.

The waveforms illustrated arise, analogously to those of part 2a of FIG. 2, if it is once more assumed that the switch 20 is closed at the time point t=0 and that a first front, which represents a transition from low to high, starts from the first delay element 10.1 and runs to further delay elements. At the time point t=13, this first front reaches the second input 13b of the NOR gate 13 whereby, at the time point t=14, a second front is caused at the input of the first delay element which goes from high to low. The further definition of the illustrated signal waveforms arises analogously as for the description appertaining to part 2a of FIG. 2.

It is pointed out that a critical point occurs in this variant, since m = 2 * n, the edge E2 of the output signal of delay element 10.13 as well as the edge D2 of the output signal of the gate 12 appear at the same time point (t = 17). In the presentation made here, this should have no effect upon the output signal of the gate 13, something which is not however guaranteed in practice.

Figure 2C:
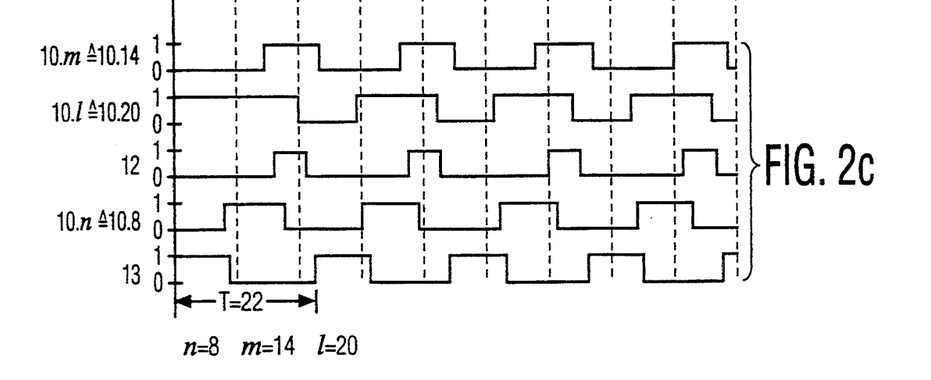

Signal waveforms of a further version of the embodiment of FIG. 1 are illustrated in part 2c of FIG. 2. For this, there were chosen n = 8, m = 14, l = 20.

One can clearly see here that the periodic time T corresponds to the above mentioned statement, namely T = l + 2 = 22 time units.

The further waveforms of the signals can be derived analogously to those already mentioned and there is no need at this point to go into this any further.

Figure 3:
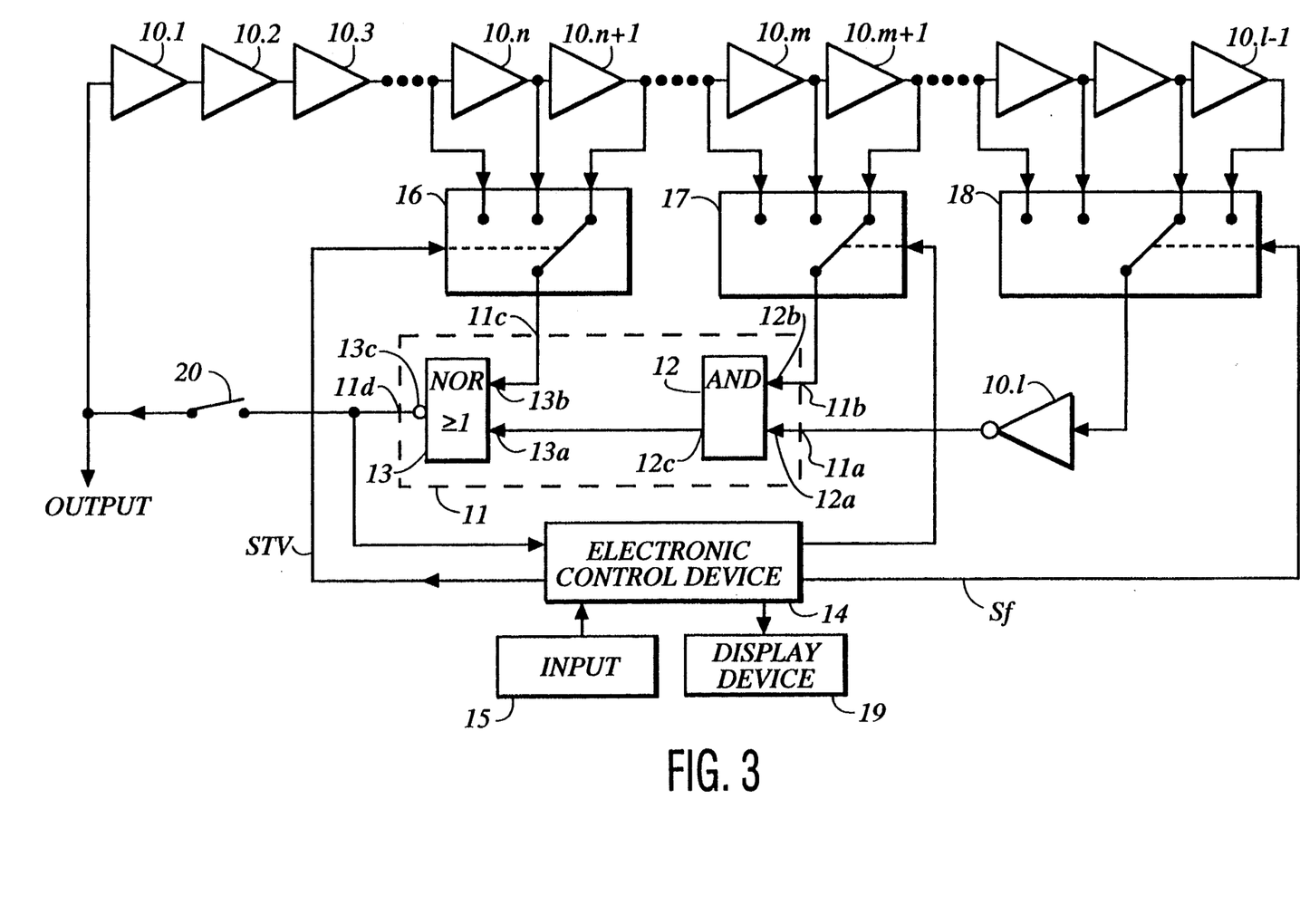
FIG. 3 shows a second embodiment of the oscillator in accordance with the invention with a data input device.

A further embodiment of the invention is illustrated in FIG. 3. There, in addition to the oscillator device, which comprises the delay elements 10.1, ..., 10.l-1 and also the last delay element 10.l, there is illustrated an electronic control unit 14 which receives signals from a data input unit 15. Via the latter, reference values for the frequency fref, corresponding to the reciprocal of the oscillatory period, and also for the duty factor TVref can be fed in.

A further input of the control device 14 is connected to the output 11d of the logic stage 11. The electronic control device 14 emits a signal STV to the control input of a duty factor switch 16 to whose switching inputs, the outputs of the delay elements 10n+1, 10.n, . . . are connected. The switching output of the duty factor switch 16 is connected to the third input 11c of the logic stage 11.

Furthermore, the electronic control device 14 emits a control signal Sm to the control input of a second switch 17, to whose switching inputs, the outputs of the delay elements 10m+1, 10.m, . . . are connected. Its switching output is connected to the second input 11b of the logic stage 11.

Furthermore, the electronic control device 14 emits a signal Sf to the control input of the frequency switch 18, to whose switching inputs, the outputs of the delay elements 10.1-1, 10.1-2, . . . are connected.

Furthermore, the electronic control device 14 is connected to a display device 19 upon which errors in entering the frequency fref and/or the duty factor TVref can be indicated.

It is self evident that the display device 19 may be constructed as a simple warning lamp as well as, as a display through which a comprehensive description of the error can take place using alphanumeric symbols.

Further, the operational states of the oscillator can be indicated by means of the display device 19.

Figure 4:
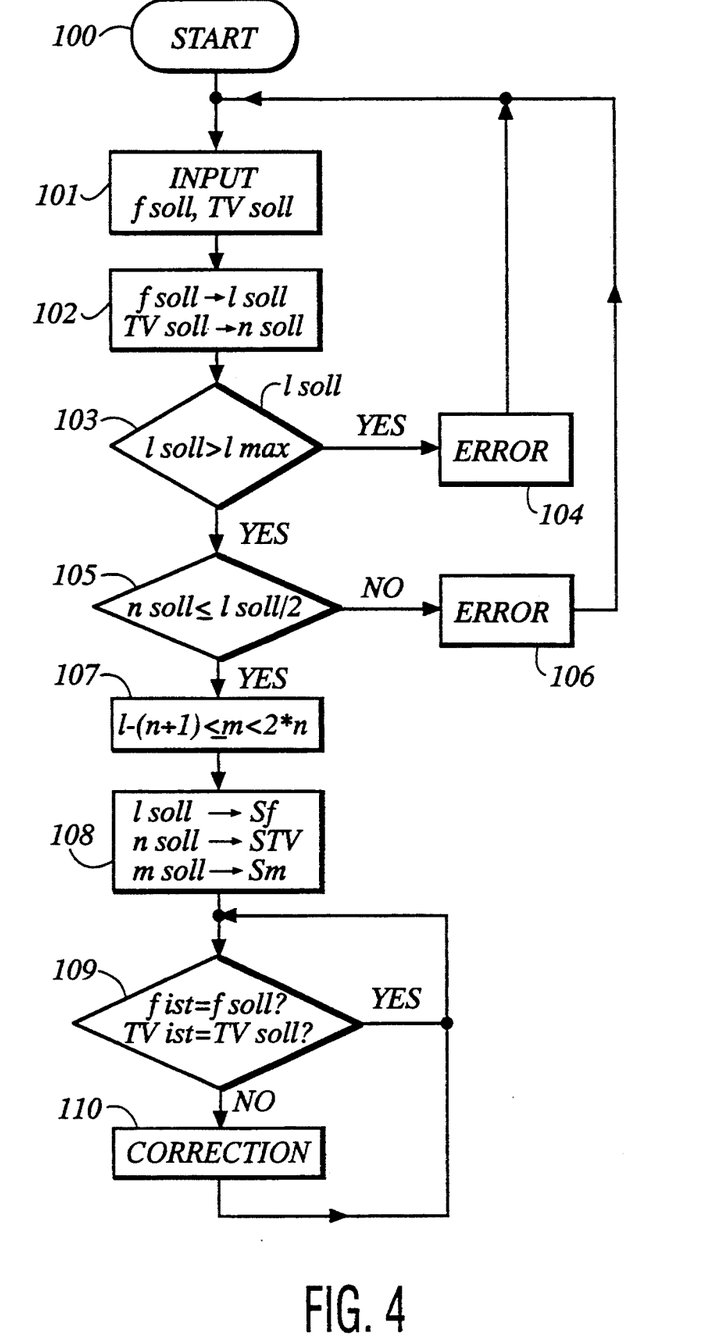
FIG. 4 shows the flow diagram of a method for setting the oscillatory period and/or the duty factor TV.

The operation of the embodiment of FIG. 3 will be explained with the help of the flow diagram of FIG. 4.

After the start at step 100, there follows the entry of reference values for the frequency fref and for the duty factor TVref via the data input unit 15 (step 101). A value Iref is determined from the value fref in step 102 and a value mref is determined from the value TVref.

In step 103, it is determined whether the value Iref is greater than a maximum value Imax which corresponds to the total number of delay elements, possibly taking into account further delays such as by the gates 12, 13 for example. In the event that it is "yes", the method in accordance with the invention leads to step 104 in which an error is indicated by the display unit 19. In the event that it is determined in step 103 that Iref is equal to or smaller than Imax, the method leads to step 105 in which it is determined whether nref is equal to or smaller than Iref/2. In the event that it is "no", this leads once more to an error indication (step 106) and, in the event that the result of the step 105 is "yes", the method continues with step 107. After the steps 104 and 106, one returns once more to the step 101 in which a new entry of frequency fref and duty factor TVref can take place.

In step 107, a value m is determined in accordance with the comments made above. Thereafter, there follows a step 108 in which
Iref is associated with a suitable control signal Sf,
nref with a suitable control signal STV and
with a suitable control signal Sm.

These control signals are passed onto the control inputs of the corresponding switches 16, 17 and 18. In step 109, the output signal which is present on the output 13c of the NOR gate 13 is compared as regards its frequency and its duty factor with the reference values and, in the event that a correction is required, this is carried out in step 110. After the step 110, or in the event that no correction is required in step 109, the interrogation of step 109 occurs again.

The comparison of the output signal with the predetermined reference values occurs by means of measures which are known to the skilled person.

Thus, it is conceivable for example, to measure the actual values by means of a frequency and phase measuring device and to use the thus obtained values for the correction. Furthermore, the use of a PLL circuit is also conceivable.

Consequently, in the embodiments of FIG. 3, the oscillatory period T can be varied when the total number I of delay elements is altered by controlling the frequency switch 18.

The duty factor TV may be predetermined by controlling the duty factor switch 16.

The said controlling of the switches. 16, 18 alters the respective positions of the delay elements from which the first, the second or the third signal are derived.

It is likewise conceivable that the individual delay times of at least some delay elements are altered. The oscillatory period T and/or the duty factor TV can thereby be varied in fine steps.

Figure 5:
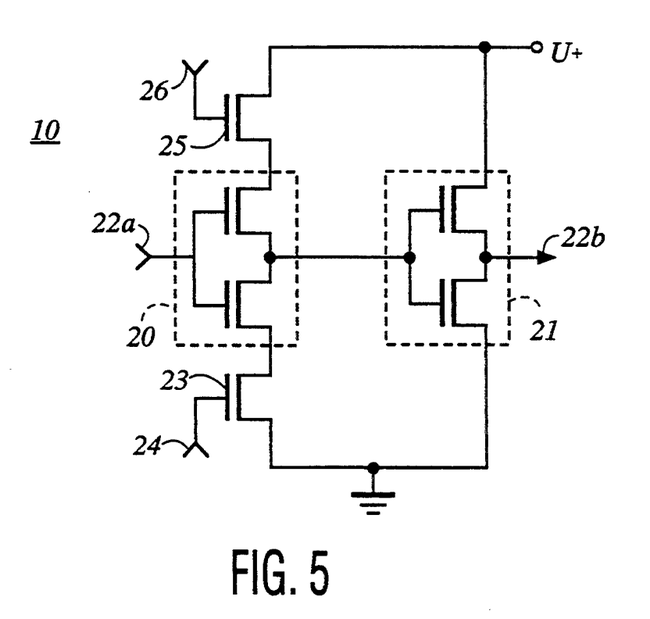
FIG. 5 shows one possible realisation of the delay elements.

A preferred embodiment of one of the delay elements 10.1 . . . 10.1-1 that is utilised is illustrated in FIG. 5.

Thus, a signal present at the input 22a can be delayed and emitted in non-inverted form at the output 22b by connecting a first inverter 20 and a second inverter 21 one behind the other.

The respective delay times of the inverters 20, 21 determine the individual delay times of the delay element 10 illustrated in FIG. 5.

In addition in FIG. 5, there are provided a first delay transistor 23 whose gate terminal leads to a first control input 24 and a second delay transistor 25 whose gate terminal leads to a second control input 26.

The delay transistors 23, 25 are connected in series with the first inverter 20, an earth terminal and a positive supply voltage U+.

The source-drain resistance of the controlled delay transistors 23 or 25 is altered by control signals at one of the control inputs 24, 26.

Upon an increase of this resistance for the first delay transistor 23, the delay time of the first inverter 20 is increased for signals having an edge at logical "low" present at the input 22.

Upon an increase of the resistance for the second delay transistor 25, the delay time of the first inverter 20 is increased for signals having an edge at logical "high" present at the input 22.

Thus, the individual delay time of the first inverter 20 and hence of the whole delay element 10 can be varied by control signals at the control inputs 24, 26.

Figure 6:
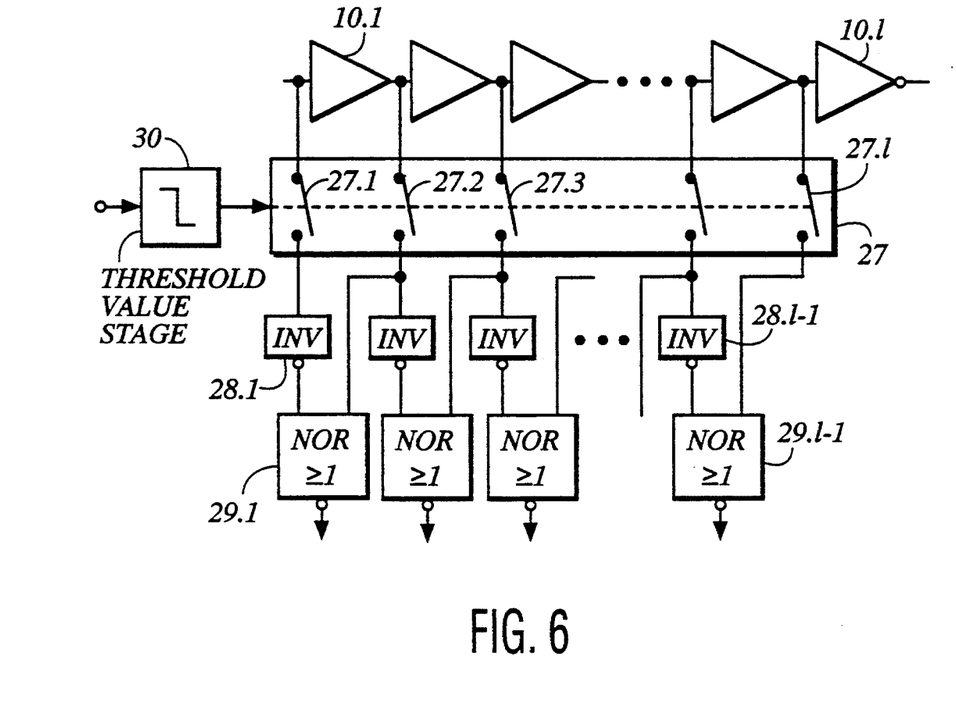
FIG. 6 shows a preferred utilisation of the oscillator in accordance with the invention as part of a phase detector.

A preferred application for oscillator devices including delay elements is illustrated in FIG. 6.

A switching device 27 contains a plurality of switching elements 27.1, . . . , 27.l which may be realised as registers, stores, retaining members (latch) or the like. The inputs of the delay elements 10.1, . . . , 10.l are connected to a respective one of the first switching terminals of the switching elements 27.1, . . . , 27.l.

Second switching terminals of the switching elements 27.2, . . . , 27.l-1 are connected to both a respective input of the inverters 28.2, . . . , 28.l-1 and a respective first input of the NOR gates 29.1, . . . , 29.l-2.

The second switching terminal of the first switching element 27.1 leads to the input of a first inverter 28.1 and the second switching terminal of a last switching element 27.l is connected only to the first input of a NOR gate 29.l-1.

The outputs of the inverters 28.1, ..., 28.l-1 are connected to respective second inputs of the NOR gates 29.1, ..., 29.l-1.

A control input of the switching device 27 leads to the output of a threshold value stage 30 to which a test signal that is to be analysed is supplied at its input.

The arrangement in accordance with FIG. 6 serves for determining the phase angle of the test signal with reference to that particular cycle at which the oscillator device is oscillating.

Upon exceeding or falling below a predetermined threshold value, the test signal causes the threshold value stage 30 to emit a signal having logical "high" or "low" at its output at the relevant time point.

For an edge denoted "high", the switching device 27 could be controlled in such a way that all of the switching elements 27.1, ..., 27.l are closed. In dependence upon, for which input signal of the delay elements 10.1, ..., 10.l there is a transition from "high" to "low", one of the NOR gates 29 emits a "high" signal.

This can be determined by a not-illustrated evaluating stage and thereupon the phase angle of the test signal with reference to the oscillator cycle can be inferred.

Preferably, the input stages of the inverter 28 are constructed in such a way that short term applied voltages are ultimately stored for example on the input (gate) capacitances.

A corresponding storage of the output signals may occur however, by means of the not-illustrated evaluating stage or its attached store.

It is furthermore conceivable that the switching device 27 is constructed as a register, store, retaining member (latch) or the like and that a storage of signals occurs here.

If, instead of the NOR gates, EXCLUSIVE NOR gates are used, then high output signals additionally occur upon a transition from "low" to "high".

Versions of this embodiment may contain combinations of features as were previously mentioned for the described embodiments.

Thus, the setting of values for the oscillatory period T and/or the duty factor TV by altering the positions and/or individual delay times of the delay elements is particularly advantageous.

A television horizontal synchronisation pulse may serve as the test signal for example. Its phase angle can be determined by the phase detector illustrated in FIG. 6 and evaluated by appropriate means. To this end, it is advantageous if the oscillator device oscillates at exactly the same frequency as the clock frequency of the television set.

This can be very closely approximated if the frequency of the oscillator cycle is monitored by a PLL circuit and then matched by a suitable control of the positions and/or individual delay times to the clock frequency.

Other reference frequencies may also be supplied to the PLL stage instead of the clock frequency and the oscillator then tuned accordingly.

The logic stage 11 may be constructed from further combinations of digital modules which are known to the skilled person.

Figure 7A:
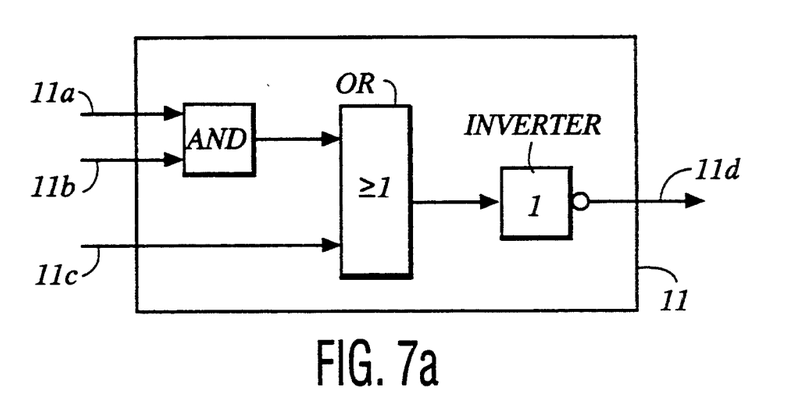
FIGS. 7a, 7b and 7c show embodiments of the logic stage.
Figure 7B:
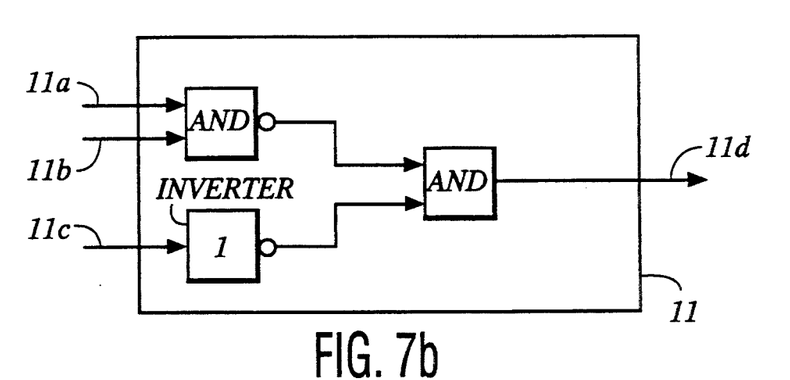
Figure 7C:
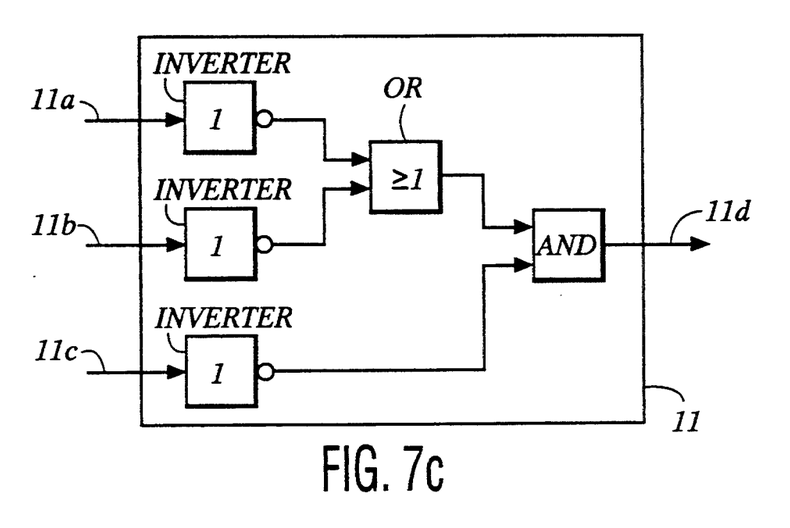

Exemplary embodiments are indicated in FIG. 7 which consists of the FIGS. 7a, 7b and c.

In the embodiments illustrated up to now, we have assumed a last delay element 10.l having inverting properties. If, instead, a non-inverting element is used then the logic stage 11 has to be adapted accordingly.

Versions of the embodiments described may have at least one of the following variants:

the delay elements 10.1, ..., 10.l-1 may each consist of two inverters which are identical with the lth delay element 10.l. Thereby, the delay times of all of the delay elements are not equal which, on the basis of the remarks above, leads to a corresponding output signal;

as part of the logic stage 11, means may be provided which detect the first switch-over of the output signal of the nth stage 10.n (edge A, A', ...) and thereupon cause a first switch-over of the oscillator output signal (edge B. B', ...). Furthermore the corresponding state of the oscillator output signal is maintained until the first switch-over of the output signal of the last delay element 10.1 occurs (edge F, F', ...). This is detected and the oscillator output signal is thereupon switched over (edge H, H', ...). The feeding of the output signal of the mth delay element 10.m can thereby be dispensed with;

if stepped output signals are supplied to low pass filters or the like, then sinusoidal, triangular etc output signals can be obtained.

Thus, an oscillator has been proposed which contains a chain of delay elements and emits an output signal whose periodic time T substantially corresponds To the total delay time of the whole chain.

The oscillator in accordance with the invention exhibits a logic stage to which signals, that may be tapped off from along the chain or be generated by auxiliary means, are supplied. The logic stage thereupon exerts an influence on the input signal of the delay element located first in the chain.

The oscillator in accordance with the invention may be used as part of a phase detector.

I claim:

1. Apparatus for generating oscillations comprising:
a chain of delay elements (10.1, ..., 10.l) for emitting at least one periodic oscillator output signal which is switched between a first value (logical "1") and a second value (logical "0") with a periodic time T; and
a logic stage (11) comprising a first signal deriver for deriving a first signal from the output signal of a last delay element (10.l), and a second signal deriver for deriving a second signal from the output signal of a selected delay element (10.n) arranged within the chain;
wherein said logic stage (11) emitting an input signal to the input of a first delay element (10.1), that the periodic time T has a value which substantially corresponds to the total delay time of the delay elements (10.1, ..., 10.l) being used, the second signal causes a switch-over of the input signal of the first delay element whereby the duty cycle of the oscillator output signal is predetermined in accordance with the position of the selected delay element (10.n), n being less than or equal to ½, and the oscillator output signal is derived from output signals of at least one of the delay elements (10.1, ..., 10.l) or of the logic stage (11).

2. Apparatus in accordance with claim 1, characterised in that, a third signal is supplied to the logic stage (11), which controls the latter in such a way that a switch-over of the input signal from its first value (logical "1") to its second value (logical "0") is only caused by the first edge (A) of the second signal and a switch-over of the input signal from its second value (logical "0") to its first value (logical "1") is only caused by the first edge (F) of the first signal.

3. Apparatus in accordance with claim 2, characterised in that, the third signal supplied is derived from the output signal of a further delay element (10.m) arranged within the chain, where m is less than 2n and m is greater than or equal to $1-(n+1)$.

4. Apparatus in accordance with any of the claims 1 to 3, characterised in that, there are provided control means (14) to which reference values for the oscillator output signals are supplied from a reference value stage, that the individual delay times of at least some of the delay elements (10.1, . . . , 10.l) arranged in the chain are predeterminable and are correspondingly controlled by the control means (14) so that the periodic time (T) and/or the duty cycle of the stage-output signals adopt predetermined values.

5. Apparatus in accordance with claim 4, characterised in that, the control means (14) control switching devices (16, 17, 18) which alter the positions of those delay elements from whose output signals the first, the second and/or the third signal are derived, and that the output signal of the last delay element (10.l) of the chain is supplied to a first input (11a) of the logic stage (11) and a further output signal of a delay element (10.m, 10.m+1, . . . ) located in the chain is supplied to a second input (11b) of the logic stage (11).

6. Use of the apparatus for generating oscillations in accordance with claim 1 as part of a phase detector, characterised in that, the apparatus for generating oscillations emits phase displaced stage-output signals which are formed from output signals of at least some of the delay elements (10.1, . . . , 10.l) arranged in the chain whereby the phase displacement of the stage-output signals is determined by their position in the chain.

7. Use in accordance with claim 6, characterised in that, the individual delay times of at least some of the delay elements (10.1, . . . , 10.l) arranged in the chain are predeterminable and that the phase displacement of the stage-output signals is predeterminable by setting the individual delay times and/or by altering the position of at least some of the delay elements (10.1, . . . , 10.l).

8. Use in accordance with claim 7, characterised in that, the apparatus for generating oscillations is arranged as part of a phase controlled (PLL) circuit which compares the output phase of a stage-output signal with the reference phase of a reference signal and, in the event of a difference between these two phases, emits an adjusting signal by means of which the individual delay times and/or the positions of at least some of the delay elements (10.1, . . . , 10.l) are altered.

9. Apparatus in accordance with claim 1, characterised in that, means are provided, which are associated with the logic stage (11) and control the latter in such a way that a switch-over of the input signal from its first value (logical "1") to its second value (logical "0") is only caused by the first edge (A) of the second signal and a switch-over of the input signal from its second value (logical "0") to its first value (logical "1") is only caused by the first edge (F) of the first signal.

10. Apparatus in accordance with claim 9, characterised in that, there are provided control means (14) to which reference values for the oscillator output signals are supplied from a reference value stage, that the individual delay times of at least some of the delay elements (10.1, . . . , 10.l) arranged in the chain are predeterminable and are correspondingly controlled by the control means (14) so that the periodic time (T) and/or the duty cycle of the stage-output signals adopt predetermined values.

\* \* \* \* \*